(12) United States Patent
Tu et al.

(10) Patent No.: US 8,466,033 B2
(45) Date of Patent: Jun. 18, 2013

(54) LIGHT EMITTING DIODE AND MANUFACTURING METHOD THEREOF

(75) Inventors: Po-Min Tu, Hsinchu (TW); Shih-Cheng Huang, Hsinchu (TW); Shun-Kuei Yang, Hsinchu (TW); Chia-Hung Huang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 170 days.

(21) Appl. No.: 13/052,127

(22) Filed: Mar. 21, 2011

(65) Prior Publication Data

US 2012/0043523 A1 Feb. 23, 2012

(30) Foreign Application Priority Data

Aug. 19, 2010 (CN) .......................... 2010 1 0257526

(51) Int. Cl.
*H01L 21/76* (2006.01)
*H01L 21/70* (2006.01)

(52) U.S. Cl.
USPC ........... 438/421; 438/319; 438/411; 257/410; 257/522

(58) Field of Classification Search
USPC .................. 438/319, 411, 421; 257/410, 522
See application file for complete search history.

(56) References Cited

U.S. PATENT DOCUMENTS

| | | | | |
|---|---|---|---|---|
| 5,994,164 A | * | 11/1999 | Fonash et al. | 438/97 |
| 7,192,818 B1 | * | 3/2007 | Lee et al. | 438/166 |
| 7,208,336 B2 | * | 4/2007 | Wu et al. | 438/35 |
| 7,273,774 B2 | * | 9/2007 | Machida et al. | 438/166 |
| 7,884,376 B2 | * | 2/2011 | Lu et al. | 257/81 |
| 8,053,789 B2 | * | 11/2011 | Yoon et al. | 257/82 |
| 8,232,567 B2 | * | 7/2012 | Dai et al. | 257/94 |
| 2005/0017261 A1 | * | 1/2005 | Ishizaki | 257/103 |
| 2006/0079033 A1 | * | 4/2006 | Machida et al. | 438/149 |
| 2006/0234408 A1 | * | 10/2006 | Lee et al. | 438/22 |
| 2007/0287232 A1 | * | 12/2007 | Lim et al. | 438/149 |
| 2008/0230791 A1 | * | 9/2008 | Lin et al. | 257/91 |
| 2010/0046567 A1 | * | 2/2010 | Liliental-Weber et al. | 372/45.011 |
| 2010/0059769 A1 | * | 3/2010 | Jeong | 257/94 |
| 2010/0133505 A1 | * | 6/2010 | Takao et al. | 257/13 |
| 2010/0244053 A1 | * | 9/2010 | Dai et al. | 257/79 |

OTHER PUBLICATIONS

"Luminescence Properties and Defects in GaN Nanocolumns Grown by Molecular Beam Epitaxy" from Physical Review B, vol. 62, No. 24, by E. Calleja, Dec. 2000.

* cited by examiner

*Primary Examiner* — Jarrett Stark
*Assistant Examiner* — Nicholas Tobergte
(74) *Attorney, Agent, or Firm* — Altis Law Group, Inc.

(57) ABSTRACT

A light emitting diode comprises a substrate, a buffer layer, a semiconductor layer and a semiconductor light emitting layer. The buffer layer is disposed on the substrate. The semiconductor layer is disposed on the buffer layer. The semiconductor light emitting layer is disposed on the semiconductor layer. A plurality of voids is defined within the semiconductor layer. Each void encloses air therein. A method for manufacturing the light emitting diode is also provided. Light generated by the semiconductor light emitting layer toward the substrate is reflected by the voids to emit out of the light emitting diode.

11 Claims, 7 Drawing Sheets

LIGHT EMITTING DIODE AND MANUFACTURING METHOD THEREOF

TECHNICAL FIELD

The disclosure relates generally to semiconductor technology, and more particularly to a light emitting diode and manufacturing method thereof.

DESCRIPTION OF THE RELATED ART

Nitride light emitting diodes capable of emitting light containing ultraviolet (UV) to blue wavelength often comprise a substrate, a gallium nitride (GaN) buffer layer allocated on the substrate and a GaN semiconductor light emitting layer allocated on the GaN buffer layer. However, partial light emitted from the GaN semiconductor light emitting layer into the substrate can promote depletion that restricts light extraction and intensity of the light emitting diode.

DETAILED DESCRIPTION

Exemplary embodiments of the disclosure are here described with the following drawings.

Figure 1:
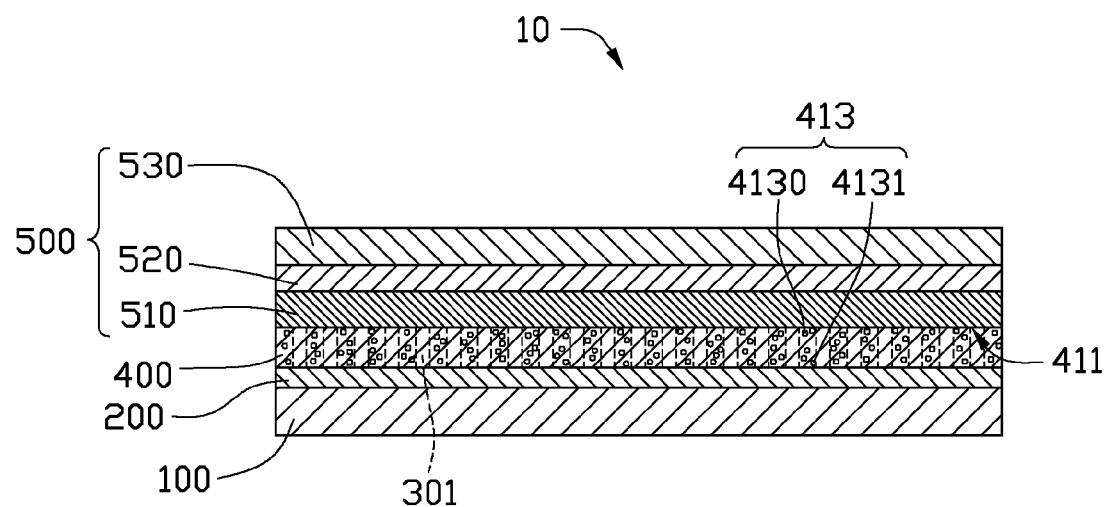
FIG. 1 is a cross section of a light emitting diode of this disclosure.

Referring to FIG. 1, the disclosure provides a light emitting diode 10 comprising a substrate 100, a buffer layer 200 disposed on the substrate 100, a semiconductor layer 400 disposed on the buffer layer 200 and a semiconductor light emitting layer 500 disposed on the semiconductor layer 400, wherein the semiconductor layer 400 comprises a plurality of voids 413.

Specifically, the substrate 100 is $Al_2O_3$ (sapphire), SiC or Si. The buffer layer 200 is nitride compound such as GaN, AlN, InN, $Mg_xN_y$/GaN, $Si_xN_y$/GaN, $In_xGa_{1-x}N/In_yGa_{1-y}N$ or $In_xAl_yGa_{1-x-y}N$. In the disclosure, thickness of the buffer layer 200 is between 20 nm and 30 nm.

The semiconductor layer 400 can be GaN, AlN, InN or $In_xAl_yGa_{1-x-y}N$ without disposing impurity. The semiconductor layer 400 comprises an intersection 411 facing the semiconductor light emitting layer 500. In the disclosure, the plurality of voids 413 is diffused within the semiconductor layer 400. Moreover, the voids 413 comprise a first portion 4130 and a second portion 4131, wherein the first portion 4130 is closer to the semiconductor light emitting layer 500. The first portion 4130 and the second portion 4131 interlace whereby projections of the first portion 4130 and the second portion 4131 of the voids 413 strewn on the substrate 100 occupy an entire top surface of the substrate 100. Accordingly, light emitted from the semiconductor light emitting layer 500 has a portion reflected by the first portion 4130 and the other portion reflected by the second portion 4131. The light emitted from the semiconductor light emitting layer 500 and toward the substrate 100 is totally reflected by the voids 413. Thus, no light will impinge on the substrate 100.

The semiconductor light emitting layer 500 comprises an n-type semiconductor layer 510 disposed on the intersection 411 of the semiconductor layer 400, a light emitting layer 520 disposed on the n-type semiconductor layer 510 and a p-type semiconductor layer 530 disposed on the light emitting layer 520. Specifically, the n-type semiconductor layer 510, the light emitting layer 520 and the p-type semiconductor layer 530 are nitride compound. The light emitting layer 520 can be single hetero structure, double hetero structure, single quantum-well or multiple quantum-wells.

The present disclosure also provides a method for manufacturing the light emitting diode 10 as follows.

Figure 2:
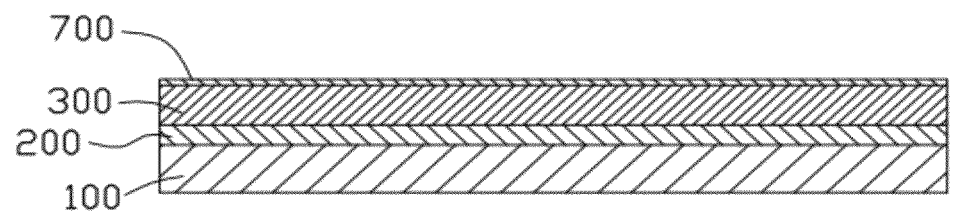
FIG. 2 is a cross section of a buffer layer, a semiconductor layer and a metal layer sequentially disposed on a substrate in accordance with one embodiment of this disclosure.

As shown in FIG. 2, a substrate 100 is provided and a buffer layer 200 disposed thereon at 450 to 800° C., wherein thickness of the buffer layer 200 is between 20 nm and 30 nm. A semiconductor layer 300 is sequentially disposed on the buffer layer 200 at 450 to 1000° C., preferably 700 to 800° C., at a thickness between 150 nm and 250 nm. A metal layer 700 is disposed on the semiconductor layer 300 with a thickness between 10 nm and 500 nm, preferably at 50 to 100 nm. Specifically, the metal layer 700 is Ni, Pt, Au, Cr or alloy thereof.

Figure 3:
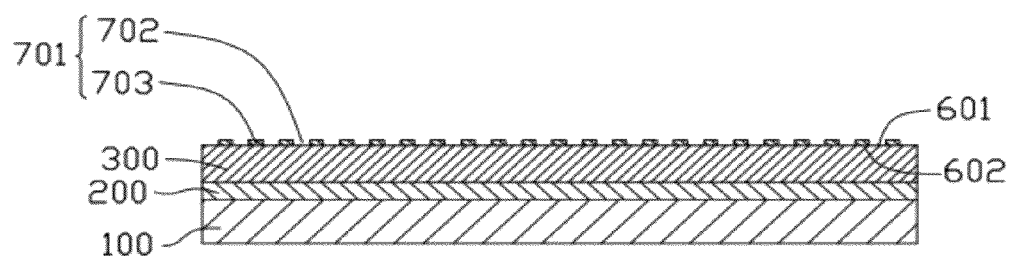
FIG. 3 is a cross section of a metal photo-mask formed on the semiconductor layer in accordance with FIG. 2.

As shown in FIG. 3, a metal mask 701 is formed on the semiconductor layer 300, constructed from the metal layer 700 using heat treatment. In the content, the metal layer 700 is exposed under a nitrogen environment at 500 to 1000° C. for 2 to 10 minutes, preferably at 800 to 1000° C. for 7 to 10 minutes. Accordingly, the metal mask 701 is formed under the heat treatment due to cohesion, wherein a plurality of clusters 703 and a plurality of holes 702 intersected between the clusters 703 are generated. Specifically, the plurality of clusters 703 is allocated on the semiconductor layer 300 in array; at diameters of about 50 nm to 100 nm. A plurality of open regions 601 of the semiconductor layer 300 is exposed through the plurality of holes 702, and a plurality of enclosed regions 602 of the semiconductor layer 300 covered by the clusters 703. In the disclosure, diameter of each of the plurality of holes 702 is about 50 nm to 100 nm.

Figure 4:
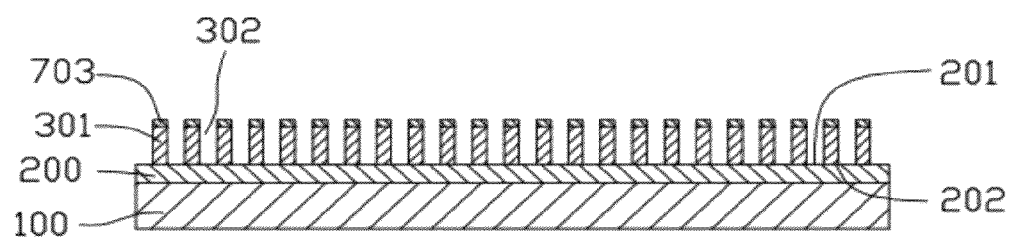
FIG. 4 is a cross section of the semiconductor layer being etched in accordance with FIG. 3.
Figure 6:
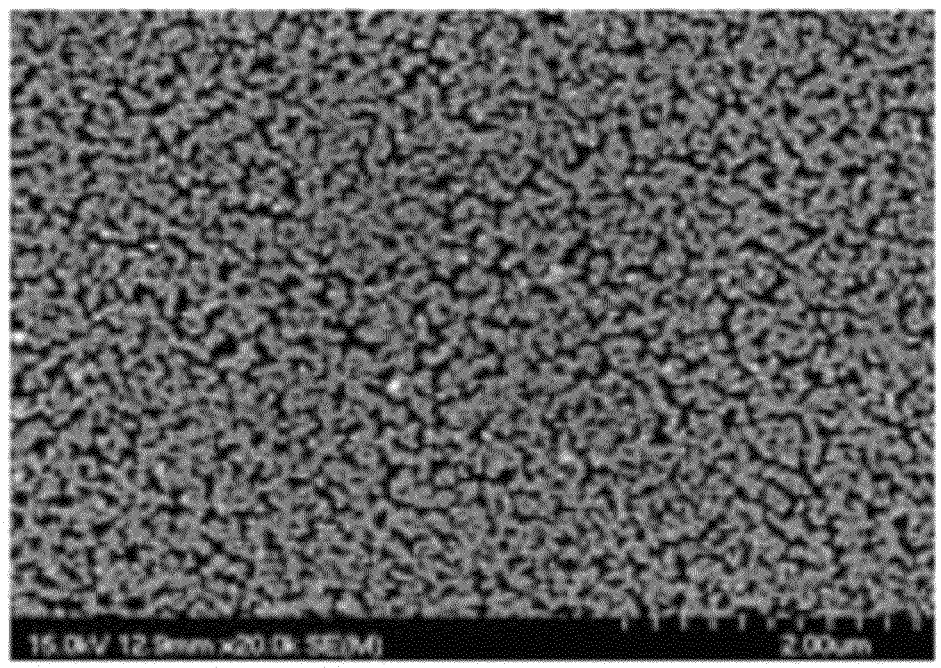
FIG. 6 is a top view of the semiconductor layer via electron microscopy in accordance with FIG. 5 of the disclosure.
Figure 7:
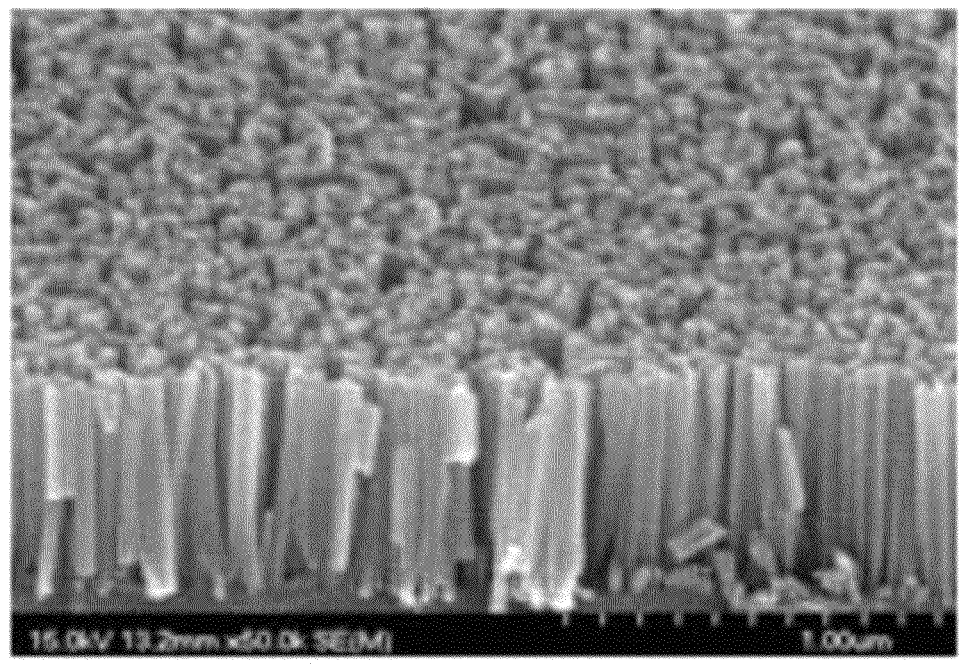
FIG. 7 is a cross section of the semiconductor layer via electron microscopy in accordance with FIG. 5 of the disclosure.

As shown in FIG. 3 and FIG. 4, a plurality of depressions 302 is formed on the semiconductor layer 300, corresponding to the plurality of open portions 601. Thereafter, a plurality of pillars 301 of the semiconductor layer 300 remains on the buffer layer 200. Moreover, the top of the plurality of pillars 301 is covered by the plurality of clusters 703 of the metal mask 701. Further, the plurality of open regions 601 of the semiconductor layer 300 is removed from the semiconductor layer 300, thereby a plurality of open zones 201 of the buffer layer 200 is exposed through the plurality of depressions 302 and a plurality of enclosed zones 202 of the buffer layer 200 is covered by the plurality of pillars 301. Accordingly, the semiconductor layer 300 is selectively etched for forming the plurality of pillars 301 in array, and the plurality of depressions 302 is interlaced between the pluralities of pillars 301, as shown in FIG. 6 and FIG. 7. Particularly, density of the plurality of depressions 302 is corresponding to the distribution of the clusters 703 upon the semiconductor layer 300. Alternatively, the plurality of open portions 601 of the semiconductor layer 300 can be partially removed, wherein a portion of the plurality of open portions 601 of the semiconductor layer 300 remains on the open zones 201 of the buffer layer 200 (not shown). Specifically, the semiconductor layer 300 is wet-etched or dry-etched.

Figure 5:
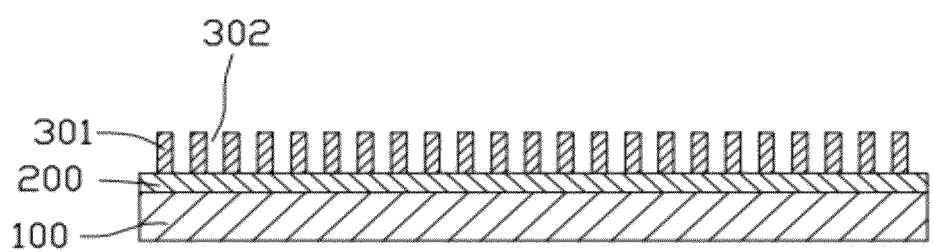
FIG. 5 is a cross section of the metal photo-mask being removed from the semiconductor layer in accordance with FIG. 4.

As shown in FIG. 5, the metal mask 701 is removed, wherein the top of the plurality of pillars 301 is exposed.

Referring to FIG. 1 and FIG. 5, the semiconductor layer 300 is continuously stacked at a high temperature, whereby a semiconductor layer 400 with a plurality of voids 413 is formed on the buffer layer 200. More specifically, after the plurality of pillars 301 and the plurality of depressions 302 are formed, the semiconductor layer 300 is re-crystallized at a temperature over 1000° C. Periphery of the semiconductor layer 300 closer to the exterior, has faster reaction speed for re-crystallizing than that of the interior inside the semiconductor layer 300. Thus, the plurality of depressions 302 is enclosed by the semiconductor layer 300, before air inside the plurality of depressions 302 is exhausted. The semiconductor layer 300 encloses each of the depression 302 between each of the adjacent two pillars 301 with a little air which turns to the voids 413 remaining between each adjacent two pillars 301. In other words, the semiconductor layer 300 has a part located between each adjacent two pillars 301 and containing the voids 413. After that, the plurality of voids 413 diffused within the semiconductor layer 400 is made. Further, an intersection 411 is formed on the semiconductor layer 400 where the plurality of depressions 302 is enclosed by the periphery of the semiconductor layer 300.

A semiconductor light emitting layer 500 is disposed on the intersection 411 of the semiconductor layer 400 by metal organic chemical vapor deposition (MOCVD) or molecular beam epitaxy (MBE). Further, the semiconductor light emitting layer 500 comprises an n-type semiconductor layer 510 disposed on the intersection 411 of the semiconductor layer 400, a light emitting layer 520 disposed on the n-type semiconductor layer 510 and a p-type semiconductor layer 530 disposed on the light emitting layer 520.

The plurality of voids 413 is embedded within the semiconductor layer 400 in three-dimension and each void 413 encloses air therein, whereby light emitted from the light emitting layer 520 is reflected direct to the light emitting surface of the light emitting diode 10 by the plurality of voids 413 due to total reflection. Accordingly, light emitted to the buffer layer 200 and the substrate 100 is restricted, so as to light emitting efficiency of the light emitting diode 10 is enhanced. Moreover, the disclosure provides the metal mask 701 formed by heat treatment but not photolithography; thus, the plurality of holes 702 of the metal mask 701 is compacter than those formed by photolithography. Accordingly, the plurality of voids 413 has higher density for reflection that light extraction from the light emitting diode 10 is enhanced.

Additionally, the semiconductor layer 400 is re-crystallized at high temperature, whereby lattice of the semiconductor layer 400 has superior quality, so as to the semiconductor light emitting layer 500 grown thereon. In the disclosure, the plurality of pillars 301 is allocated in array by MOCVD and etching; alternatively, it also can be formed by MBE without allocating the metal mask 701, etching the semiconductor layer 300 and removing the metal mask 701, as disclosed in "Luminescence Properties and Defects in GaN Nanocolumns Grown by Molecular Beam Epitaxy" from Physical Review B, Vol. 62, No. 24.

It is to be understood, however, that even though multiple characteristics and advantages of the disclosure have been set forth in the foregoing description, together with details of the structure and function of the invention disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method for manufacturing a light emitting diode, comprising:
   providing a substrate;
   forming a semiconductor layer, having a plurality of pillars thereon, on the substrate;
   re-crystallizing the semiconductor layer, wherein a plurality of voids is formed between each of adjacent two of the plurality of pillars and within the semiconductor layer, each of the plurality of voids enclosing air therein; and
   disposing a semiconductor light emitting layer on the semiconductor layer.

2. The method for manufacturing the light emitting diode as claimed in claim 1, further comprising forming a buffer layer on the substrate, wherein the semiconductor layer is formed on the buffer layer.

3. The method for manufacturing the light emitting diode as claimed in claim 1, further comprising:
   forming a metal layer on the semiconductor layer;
   forming the metal layer to come into a metal mask using heat treatment at a temperature of 500 to 1000° C.;
   etching the semiconductor layer to come into the plurality of voids in array; and
   removing the metal mask.

4. The method for manufacturing the light emitting diode as claimed in claim 1, wherein an intersection is formed on a top of the semiconductor layer.

5. The method for manufacturing the light emitting diode as claimed in claim 1, wherein the semiconductor layer is re-crystallized at a temperature over 1000° C.

6. The method for manufacturing the light emitting diode as claimed in claim 2, wherein the buffer layer is formed at 450 to 1000° C.

7. The method for manufacturing the light emitting diode as claimed in claim 6, wherein the semiconductor layer is formed on the buffer layer at 700 to 800° C.

8. The method for manufacturing the light emitting diode as claimed in claim 1, wherein thickness of the semiconductor layer is between 150 and 250 nm.

9. The method for manufacturing the light emitting diode as claimed in claim 3, wherein the metal mask comprising a plurality of clusters and a plurality of holes intersecting between the clusters.

10. The method for manufacturing the light emitting diode as claimed in claim 9, wherein diameter of each of the plurality of clusters is between 50 and 100 nm and diameter of each of the plurality of holes is between 50 and 100 nm.

11. The method for manufacturing the light emitting diode as claimed in claim 1, wherein the plurality of pillars is formed by MBE.

* * * * *